US006152257A

United States Patent [19]

Denham

[11] Patent Number: 6,152,257

[45] Date of Patent: Nov. 28, 2000

[54] AUDIO SPEAKER

[75] Inventor: Thomas L. Denham, 602 N. Market St., Winamac, Pulaski County, Ind. 46996

[73] Assignees: Thomas L. Denham; Denham Pyramidal Corp.

[21] Appl. No.: 09/304,370

[22] Filed: May 4, 1999

Related U.S. Application Data

[60] Provisional application No. 60/084,297, May 5, 1998.

[51] Int. Cl.$^{7}$ ........................................ H05K 5/00

[52] U.S. Cl. ........................ 181/155; 181/199; 181/144

[58] Field of Search ........................ 181/144, 147, 181/148, 154, 155, 199

[56] References Cited

U.S. PATENT DOCUMENTS

| | | | |
|---|---|---|---|
| D. 281,316 | 11/1985 | Gary . | |
| 3,912,866 | 10/1975 | Fox . | |
| 4,182,931 | 1/1980 | Kenner . | |
| 4,200,170 | 4/1980 | Williams, Jr. . | |
| 4,876,723 | 10/1989 | Fang | 181/155 |
| 4,991,688 | 2/1991 | Kery et al. . | |
| 5,086,871 | 2/1992 | Barbe . | |
| 5,115,882 | 5/1992 | Woody . | |
| 5,418,336 | 5/1995 | Negishi et al. . | |

*Primary Examiner*—Khanh Dang
*Attorney, Agent, or Firm*—Gary M. Hartman; Domenica N. S. Hartman

[57] ABSTRACT

A high-fidelity (hi-fi) stereo speaker (110) having a three-sided pyramidal-like cabinet (112) with pyramid-like reflectors (118, 120) that reflect sound through openings (124, 126) in three sidewalls (122A, 122B) of the cabinet (112). The speaker (110) includes a tweeter (114) and woofer (116), and optionally a midrange (128) mounted in the cabinet (112) between the tweeter (116) and woofer (116). The tweeter (114) faces upward to reflect sound off one of the reflectors (118) that faces downwardly from near the top of the cabinet (112). The woofer (116) faces downwardly, firing at one of the reflectors (120) that faces upwardly from near the bottom of the cabinet (112). The speaker (110) is configured to deliver sound through each of the three sidewalls (122A, 122B) of the cabinet (112), i.e., in three directions roughly 120 degrees apart—rearward from the speaker (110) through a sidewall (122B) designated as the backwall, and 60 degrees to either side of a forward direction from the front of the speaker (110).

20 Claims, 1 Drawing Sheet

AUDIO SPEAKER

This utility patent application claims the benefit of U.S. Provisional Application Ser. No. 60/084,297, filed May 5, 1998.

BACKGROUND OF THE INVENTION

1. Field of the Invention

The present invention generally relates to speakers for audio systems. More particularly, this invention relates to a speaker system having a three-sided pyramidal-like cabinet with pyramid-like reflectors.

2. Description of the Prior Art

Various designs and constructions have been proposed for audio speakers and their cabinets, some of which adopt pyramidal-shaped components. For example, U.S. Pat. No. 3,912,866 to Fox, U.S. Pat. No. 4,200,170 to Williams, Jr., and U.S. Pat. No. 5,086,871 to Barbe each disclose one or more speakers (tweeters and/or woofers) whose sound is reflected off a pyramid reflector. Fox employs a single speaker 24 and reflector 32, with the speaker 24 facing the back of the cabinet 12 and the reflector 32 serving to reflect sound toward the front of the cabinet. Williams discloses a vertical series of speakers 26 (FIGS. 2 and 3), each equipped with its own pyramid reflector 32. In FIG. 3, the reflectors 32 are between the speakers 26, and the speakers 26 face each other. Barbe discloses a woofer 4 and tweeter 7 mounted on pyramid reflectors 13 and 12, respectively. A diffuser 9 is placed between the woofer 4 and tweeter 7. U.S. Pat. No. 4,991,688 to Kery discloses a pyramid-shaped speaker enclosure 10 that may be fitted with a pyramid-shaped grill 52 (FIGS. 2 and 7). Finally, U.S. Pat. No. Des. 281,316 to Gary appears to portray a speaker system that includes a woofer and tweeter, vertically arranged, with pyramid reflectors.

A perceived drawback of the above speakers utilizing a standard four-sided pyramid reflector is that sound is reflected from such a reflector in directions 90 degrees apart. As a result, the sound can be reflected by an adjacent wall straight back toward the speaker, resulting in sound cancelation or distortion. An additional shortcoming of the speaker disclosed by Barbe is the additional cancellation of sound as a result of the tweeter and bass facing each other in the cabinet.

SUMMARY OF THE INVENTION

According to the present invention, there is provided a high-fidelity (hi-fi) stereo speaker having a three-sided pyramidal-like cabinet with pyramid-like reflectors that reflect sound through openings in the sidewalls of the cabinet. More particularly, the cabinet is shaped similarly to a pyramid, but with only four sides, each of which has a triangular shape. One side is designated the base, while the remaining three sides are designated the sidewalls. The speaker is configured to deliver sound through each of the three sidewalls of the cabinet, i.e., in three directions roughly 120 degrees apart—rearward from the speaker through a sidewall designated as the backwall, and 60 degrees to either side of a forward direction from the front of the speaker. The speaker is intended to be placed with the backwall facing a wall or other hard surface, such that the rearward-directed sound is reflected at the wall surface.

The speaker includes a tweeter and woofer, both of which are preferably located near the vertical center of the cabinet. A midrange is also preferably mounted in the cabinet between the tweeter and woofer. The tweeter faces upward to reflect sound off a downwardly-facing three-sided reflector near the top of the cabinet. Similar to the cabinet, the reflector has a pyramid-like shape with only three sidewalls. The reflector sidewalls reflect sound through three openings in the three sidewalls of the cabinet. The woofer faces downwardly, firing at an upwardly-facing three-sided reflector located near the bottom of the cabinet. As with the reflector paired with the tweeter, the reflector paired with the woofer has a pyramid-like shape with three reflecting sidewalls that reflect sound through an additional three openings in the three sidewalls of the cabinet.

The speaker of this invention provides excellent separation and avoids the effect that sound is from a single point in a room in which the speaker is placed.

DETAILED DESCRIPTION OF THE PREFERRED EMBODIMENT

As shown in the Figures, speakers in accordance with this invention have a cabinet with a pyramid-like shape. While pyramids are geometrically defined as a five-sided solid figure with a polygonal base and four triangular-shaped sides, the cabinet of this invention has a triangular-shaped base and only three sides, or sidewalls. Throughout the following discussion, the shape of the cabinets and reflectors within the cabinets will be referred to as pyramidal, though with the understanding that their shapes are not true pyramids, but instead have the pseudo-pyramidal shape shown in the Figures.

Each of the speakers shown in the Figures utilizes a pyramidal cabinet to direct and send sound waves in multiple directions. Sound is directed outward from each sidewall, and therefore in three directions roughly 120 degrees apart. One of the sidewalls, designated a backwall, is intended to direct sound toward a wall or other hard surface for subsequent reflection.

Figure 1:
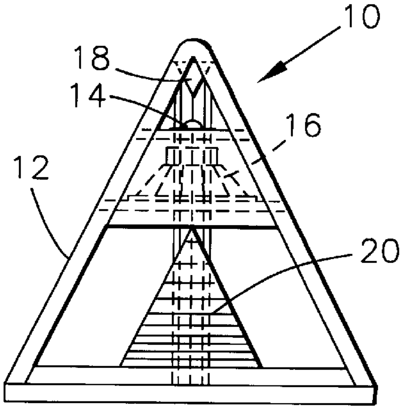
FIG. 1 is an interior view of a speaker in accordance with a first embodiment of the present invention.
Figure 2:
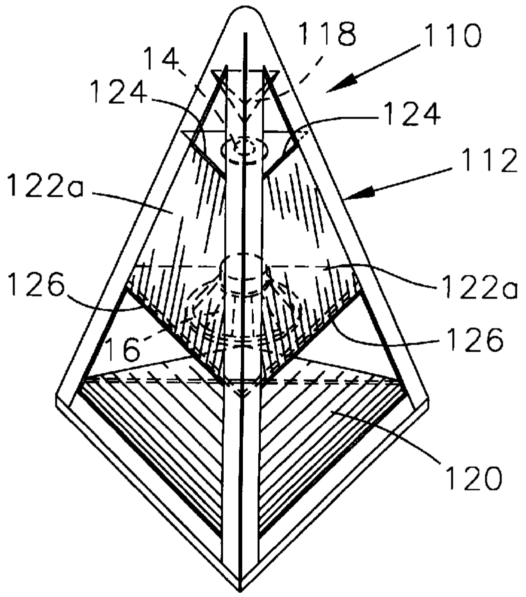
FIG. 2 is a front perspective view of a speaker in accordance with a preferred embodiment of the present invention.
Figure 3:
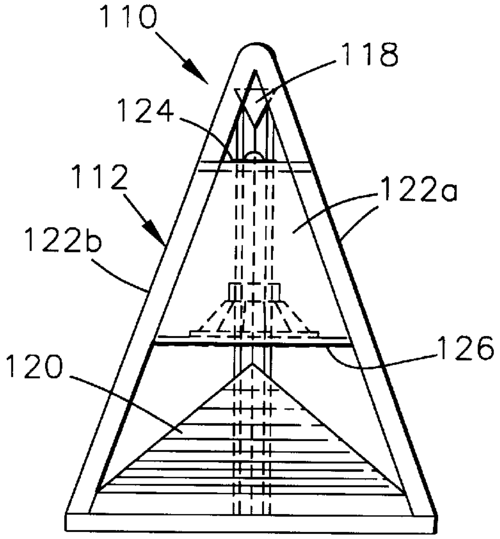
FIG. 3 is an exterior view of a front sidewall of the speaker of FIG. 2.

In FIG. 1, a speaker 10 is shown having a pyramidal cabinet 12 with a tweeter 14 and woofer 16 mounted near the vertical center of the cabinet 12. FIG. 1 is a view looking through a sidewall of the cabinet 12. One of the sidewalls is designated the backwall, and is intended to face a wall or other hard surface so that sound projected through the backwall is subsequently reflected. As shown, the tweeter 14 faces upwardly to reflect sound off a downwardly-facing three-sided pyramidal reflector 18 near the top of the cabinet 12. The walls of the reflector 18 reflect sound in three directions through three openings in the three sidewalls of the cabinet 12. The woofer 16 faces downwardly, firing at an upwardly-facing reflector 20 located near the base of the cabinet 12. As with the reflector 18 paired with the tweeter 14, the reflector 20 paired with the woofer 16 has a pyramid-like shape with three reflecting walls that reflect sound through an additional three openings in the three sidewalls of the cabinet 12.

Figure 4:
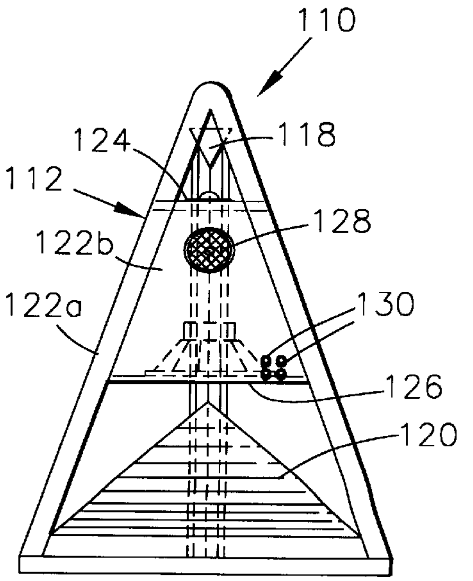
FIG. 4 is a rear exterior view of a rear sidewall of the speaker of FIG. 2.
Figure 5:
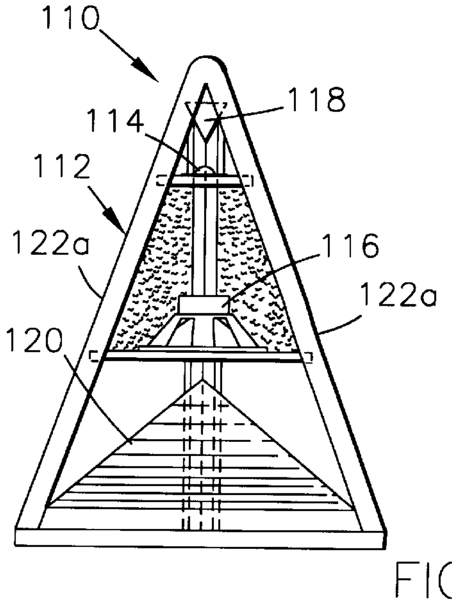
FIG. 5 is a rear interior view of the speaker of FIG. 2.

In FIGS. 2 through 5, a speaker 110 in accordance with a preferred embodiment of this invention is shown to also have a pyramidal-shaped cabinet 112 with two sidewalls designated as front sidewalls 122A and a third sidewall designated as a back sidewall 122B. In FIG. 5, a tweeter 114 and woofer 116 are shown as being mounted near the vertical center of the cabinet 112. In this embodiment, the front sidewalls 122A and back sidewall 122B are each at an angle of approximately 70 degrees from horizontal. The sidewalls 122A and 122B intersect each other to define three edges inclined at angles of approximately 60 degrees from horizontal. The tweeter 114 faces upward to reflect sound off a downward-facing three-sided pyramidal reflector 118 near the top of the cabinet 112. The reflector 118 has three reflecting walls that are at roughly 70 degrees to horizontal, and reflect sound in three directions through three openings 124 in the three sidewalls 122A and 122B near the upper end of the cabinet 112. The woofer 116 faces downwardly toward an upward-facing three-sided pyramidal reflector 120 located on or near the base of the cabinet 112. As with the reflector 118 paired with the tweeter 114, the reflector 120 has three reflecting walls that reflect sound through three openings 126 in the three sidewalls 122A and 122B near the base of the cabinet 112. The walls of the reflector 120 are roughly 42 degrees to horizontal.

In the preferred embodiment, the speaker 110 also includes a midrange 128 that projects sound through the back sidewall 122B as shown in FIG. 4. As such, the midrange 128 directs sound through the back sidewall 122B toward a nearby wall or other hard surface for subsequent reflection. The midrange speaker 128 is not necessary, but enables mid-frequency sound at high levels while also contributing bass. Also shown in FIG. 4 are speaker wire connectors 130, which can be of any suitable type.

The cabinet 112 is preferably constructed of triangular-shaped panels of hardwood or another suitable material. The panels can be mounted with a track (not shown) that allow the sidewalls 122A and 122B to slip in and allow for expansion and contraction due to temperature changes. As shown, the corners of the cabinet 112 are preferably rounded to eliminate sharp edges. The size of the cabinet 112 can be readily varied to yield large and small versions of the speaker 110, with the only restriction being the drive size. According to the invention, the angles of the sidewalls 122A and 122B and reflectors 118 and 120 cause the cabinet 112 to delay higher frequencies and direct sound toward the ceiling of the room in which the speaker 110 is placed. Facing downwardly, the woofer 116 is able to employ the base of the cabinet 112 and the surrounding floor to transmit low frequencies. With a pair of speakers 110 of the type shown, sound initially travels in three directions from each speaker 110. Sound emitted through the near sidewalls 122A crosses and sound emitted through the back sidewalls 122B is reflected, thereby adding to the fullness of the audio effect. The relative angles between the reflectors 118 and 120 and the sidewalls 122A and 122B also contribute to a fuller sound effect.

While the invention has been described in terms of a preferred embodiment, it is apparent that other forms could be adopted by one skilled in the art. Accordingly, it should be understood that the invention is not limited to the specific embodiment illustrated in the Figures. It should also be understood that the phraseology and terminology employed above are for the purpose of disclosing the illustrated embodiments, and do not necessarily serve as limitations to the scope of the invention. Instead, the scope of the invention is to be limited only by the following claims.

What is claimed is:

1. An audio speaker system comprising:

a cabinet having sidewalls and a base;

at least one audio speaker within the cabinet:

an opening in each of the sidewalls; and a reflector disposed in the cabinet for reflecting sound through each of the openings in the sidewalls, the reflector having three reflecting walls for reflecting sound in three directions from the cabinet.

2. The audio speaker system set forth in claim 1, wherein the cabinet has three sidewalls, each of the sidewalls facing a corresponding one of the three reflecting walls of the reflector.

3. The audio speaker system set forth in claim 1, wherein the reflecting walls of the reflector are each at about 70 degrees to horizontal.

4. The audio speaker system set forth in claim 1, wherein the reflecting walls of the reflector are each at about 42 degrees to horizontal.

5. The audio speaker system set forth in claim 1, wherein each of the reflecting walls of the reflector has a triangular shape such that the reflector has a pyramidal shape.

6. The audio speaker system set forth in claim 1, wherein sound is reflected by the reflector in three directions roughly 120 degrees apart.

7. The audio speaker system set forth in claim 1, wherein the at least one audio speaker comprises a tweeter located near the reflector, the tweeter generating sound toward the reflector such that the sound is reflected off the reflector.

8. The audio speaker system set forth in claim 7, wherein the tweeter faces upward and the reflector is downward-facing.

9. The audio speaker system set forth in claim 1, wherein the at least one audio speaker comprises a woofer located near the reflector, the woofer generating sound toward the reflector such that the sound is reflected off the reflector.

10. The audio speaker system set forth in claim 9, wherein the woofer faces downward and the reflector is upward-facing.

11. The audio speaker system set forth in claim 1, wherein the openings in the sidewalls and the reflector are first openings and a first reflector., respectively, located adjacent the base of the cabinet, the audio speaker system further comprising:

a second opening in each of the sidewalls above the first openings; and a second reflector disposed in the cabinet for reflecting sound through each of the second openings in the sidewalls, the second reflector reflecting sound in three directions from the cabinet.

12. An audio speaker comprising:

a cabinet having sidewalls and a base;

a first opening in each of the sidewalls adjacent the base of the cabinet;

a first reflector disposed in the cabinet for reflecting sound through each of the first openings in the sidewalls, the first reflector reflecting sound in three directions from the cabinet;

a second opening in each of the sidewalls above the first openings;

a second reflector disposed in the cabinet for reflecting sound through each of the second openings in the sidewalls the second reflector reflecting sound in three directions from the cabinet;

a woofer located near the first reflector for generating sound toward the first reflector such that the sound thereof is reflected off the first reflector, the woofer facing downwardly and the first reflector facing upwardly toward the woofer;

a tweeter located near the second reflector for generating sound toward the second reflector such that the sound thereof is reflected off the second reflector, the tweeter facing upwardly and the second reflector facing downwardly toward the tweeter; and a midrange mounted in the cabinet between the tweeter and woofer.

13. The audio speaker set forth in claim 12, wherein the midrange is mounted in one of the sidewalls of the cabinet and faces outwardly for transmitting sound through the one sidewall of the cabinet.

14. An audio speaker comprising:

a cabinet having three sidewalls and a base wall attached to each of the sidewalls, the sidewalls and the base wall each having a triangular shape such that the cabinet has a pyramidal shape;

an upper opening and a lower opening in each of the sidewalls;

an upper reflector disposed in the cabinet adjacent the upper openings, the upper reflector having three reflecting walls for reflecting sound through each of the upper openings;

a lower reflector disposed in the cabinet adjacent the lower openings, the lower reflector having three reflecting walls for reflecting sound through each of the lower openings;

a tweeter located near the upper reflector for generating sound toward the upper reflector such that the sound thereof is reflected off the upper reflector, the tweeter facing upwardly and the upper reflector facing downwardly toward the tweeter;

a woofer located near the lower reflector for generating sound toward the lower reflector such that the sound thereof is reflected off the lower reflector, the woofer facing downwardly and the lower reflector facing upwardly toward the woofer; and a midrange mounted in the cabinet between the tweeter and woofer.

15. The audio speaker set forth in claim 14, wherein the reflecting walls of the upper reflector are each at about 70 degrees to horizontal.

16. The audio speaker set forth in claim 14, wherein the reflecting walls of the lower reflector are each at about 42 degrees to horizontal.

17. The audio speaker set forth in claim 14, wherein each of the reflecting walls of each of the upper and lower reflectors has a triangular shape such that the upper and lower reflectors each have a pyramidal shape.

18. The audio speaker set forth in claim 14, wherein the upper and lower openings and the sidewalls are configured so that audio sound is reflected by the upper and lower reflectors in three directions roughly 120 degrees apart.

19. The audio speaker set forth in claim 14, wherein the midrange is mounted in one of the sidewalls of the cabinet and faces outwardly for transmitting sound through the one sidewall of the cabinet.

20. The audio speaker set forth in claim 14, wherein the sidewalls of the cabinet are each at an angle of about 70 degrees from horizontal, and wherein the sidewalls intersect each other to define three edges inclined at angles of about 60 degrees from horizontal.

* * * * *